(12) United States Patent
Hsu et al.

(10) Patent No.: US 9,847,473 B2
(45) Date of Patent: Dec. 19, 2017

(54) MRAM STRUCTURE FOR PROCESS DAMAGE MINIMIZATION

(71) Applicant: Taiwan Semiconductor Manufacturing Co., Ltd., Hsin-Chu (TW)

(72) Inventors: Chern-Yow Hsu, Chu-Bei (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/688,073

(22) Filed: Apr. 16, 2015

(65) Prior Publication Data

US 2016/0308119 A1 Oct. 20, 2016

(51) Int. Cl.
| | |
|---|---|
| *H01L 21/02* | (2006.01) |
| *H01L 29/82* | (2006.01) |
| *H01L 43/08* | (2006.01) |
| *H01L 43/02* | (2006.01) |
| *H01L 43/12* | (2006.01) |

(52) U.S. Cl.
CPC .............. *H01L 43/08* (2013.01); *H01L 43/02* (2013.01); *H01L 43/12* (2013.01)

(58) Field of Classification Search
CPC ......... H01L 43/08; H01L 43/12; H01L 43/02; H01L 27/222; H01L 27/226; H01L 27/228; H01L 29/82; G01R 33/066
See application file for complete search history.

(56) References Cited

U.S. PATENT DOCUMENTS

| | | | |
|---|---|---|---|
| 7,781,231 B2 | 8/2010 | Li | |
| 8,278,122 B2 | 10/2012 | Lu et al. | |
| 8,455,267 B2 | 6/2013 | Li et al. | |
| 2002/0155627 A1 | 10/2002 | Okazawa et al. | |
| 2004/0174740 A1* | 9/2004 | Lee ........................ | B82Y 10/00 365/171 |

(Continued)

OTHER PUBLICATIONS

U.S. Appl. No. 13/935,210, filed Jul. 3, 2013.

(Continued)

*Primary Examiner* — Su C Kim
(74) *Attorney, Agent, or Firm* — Eschweiler & Potashnik, LLC (57) ABSTRACT

The present disclosure relates to a magneto-resistive random access memory (MRAM) cell having an extended upper electrode, and a method of formation. In some embodiments, the MRAM cell has a magnetic tunnel junction (MTJ) arranged over a conductive lower electrode. A conductive upper electrode is arranged over the magnetic tunnel junction. The conductive upper electrode has a lower portion and an upper portion. The lower portion overlies the magnetic tunnel junction and is laterally surrounded by an encapsulation structure. The upper portion is arranged onto the lower portion and the encapsulation structure, and laterally extends past the lower portion of the conductive upper electrode. By laterally extending past the lower portion, the upper portion of the conductive upper electrode gives a via a larger landing area than the lower portion of the upper electrode would provide, thereby mitigating via punch through resulting from overlay errors.

20 Claims, 8 Drawing Sheets

(56) References Cited

U.S. PATENT DOCUMENTS

| | | | |
|---|---|---|---|
| 2007/0048950 A1 | 3/2007 | Kanakasabapathy et al. | |
| 2009/0085132 A1 | 4/2009 | Kao et al. | |
| 2009/0130779 A1* | 5/2009 | Li | H01L 43/12 438/3 |
| 2009/0209050 A1 | 8/2009 | Wang et al. | |
| 2011/0049656 A1* | 3/2011 | Li | G11C 11/16 257/421 |
| 2012/0074511 A1* | 3/2012 | Takahashi | H01L 27/228 257/427 |
| 2012/0205764 A1 | 8/2012 | Chen et al. | |
| 2013/0026585 A1 | 1/2013 | Sung et al. | |
| 2013/0058162 A1* | 3/2013 | Yamanaka | H01L 43/08 365/173 |
| 2013/0119494 A1* | 5/2013 | Li | H01L 43/08 257/421 |
| 2014/0227804 A1 | 8/2014 | Hsu et al. | |
| 2015/0171314 A1* | 6/2015 | Li | G11C 11/161 257/421 |

OTHER PUBLICATIONS

Durlam, et al. "A low power 1Mbit MRAM based on 1T1MTJ bit cell integrated with Copper Interconnects." VLSI Symposium, 2002.

Engel, et al. "A 4-Mb Toggle MRAM Based on a Novel Bit and Switching Method." IEEE Transactions on Magnetics, vol. 41, No. 1, Jan. 2005.

* cited by examiner

MRAM STRUCTURE FOR PROCESS DAMAGE MINIMIZATION

BACKGROUND

Many modern day electronic devices contain electronic memory configured to store data. Electronic memory may be volatile memory or non-volatile memory. Volatile memory stores data while it is powered, while non-volatile memory is able to store data when power is removed. Magneto-resistive random-access memory (MRAM) is one promising candidate for next generation non-volatile memory technology. An MRAM cell includes a magnetic tunnel junction (MTJ) having a variable resistance, which is located between two electrodes disposed within back-end-of-the-line (BEOL) metallization layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magneto-resistive random-access memory (MRAM) cells are configured to store data using magnetic storage elements. Typically, MRAM cells comprise a magnetic tunnel junction (MTJ) vertically arranged with a back-end-of-the-line (BEOL) metal stack between a lower electrode and an upper electrode. The MTJ comprises a pinned magnetic layer and a free magnetic layer, which are vertically separated by a dielectric barrier layer. The magnetic orientation of the pinned magnetic layer is static (i.e., fixed), while the magnetic orientation of the free magnetic layer is capable of switching between a parallel configuration with respect to that of the pinned magnetic layer and an anti-parallel configuration. The parallel configuration provides for a low resistance state that digitally stores data as a first bit value (e.g., a logical "0"). The anti-parallel configuration provides for a high resistance state that digitally stores data as a second bit value (e.g., a logical "1").

As the functionality of integrated chips increase, the need for more memory also increases, causing integrated chip designers and manufacturers to have to increase the amount of available memory while decreasing the size and power consumption of an integrated chip. To reach this goal, the size of memory cell components has been aggressively shrunk over the past few decades. In MRAM memory cells, as the size of memory cell components decreases, the ability to land a metal interconnect via onto the upper electrode becomes increasingly difficult since the overlay tolerance between the via and the upper electrode will decrease. It has been appreciated that overlay errors can cause a via to be offset from the upper electrode, resulting in via punch through (e.g., a via hole extending along a side of an upper electrode to an underlying layer) and device shorting.

Accordingly, the present disclosure relates to a magneto-resistive random access memory (MRAM) cell having an extended upper electrode, and a method of formation. The extended upper electrode provides a larger landing area for an overlying via without increasing a size of a magnetic tunnel junction (MTJ) of an MRAM cell, thereby mitigating fabrication via punch through resulting from overlay errors between the via and the upper electrode. In some embodiments, the MRAM cell has a magnetic tunnel junction (MTJ) arranged over a conductive lower electrode. A conductive upper electrode is arranged over the magnetic tunnel junction. The conductive upper electrode has a lower portion and an upper portion. The lower portion overlies the magnetic tunnel junction and is laterally surrounded by an encapsulation structure. The upper portion is arranged onto the lower portion and the encapsulation structure, and laterally extends past the lower portion of the conductive upper electrode to form the extended upper electrode.

Figure 1:
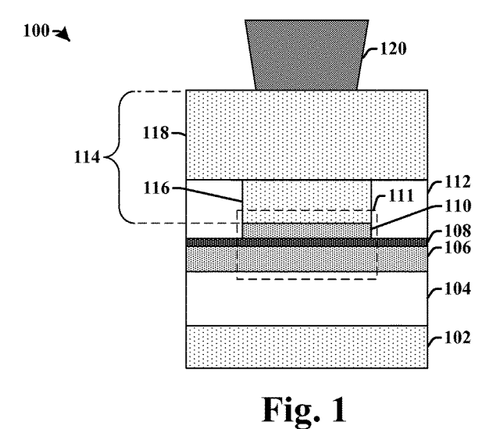
FIG. 1 illustrates some embodiments of a magneto-resistive random-access memory (MRAM) cell having an extended upper electrode.

FIG. 1 illustrates some embodiments of a magneto-resistive random access memory (MRAM) cell 100 having an extended upper electrode.

The MRAM cell 100 comprises a conductive lower electrode 102. An anti-ferromagnetic layer 104 is arranged over the conductive lower electrode 102, and a pinned magnetic layer 106 is arranged over the anti-ferromagnetic layer 104. The anti-ferromagnetic layer 104 comprises a material with strong exchange coupling, which has atoms with magnetic moments aligned in a regular pattern with neighboring spins pointing in opposite directions. The strong exchange coupling allows for the anti-ferromagnetic layer 104 to pin (i.e., fix) the magnetic polarization of the pinned magnetic layer 106, thereby preventing the magnetic polarization of the pinned magnetic layer 106 from switching (e.g., during write operations). In some embodiments, a synthetic anti-ferromagnetic (SAF) layer (not shown) may be disposed between the anti-ferromagnetic layer 104 and the pinned magnetic layer 106.

The pinned magnetic layer 106 is vertically separated from a free magnetic layer 110 by way of a dielectric barrier layer 108. The free magnetic layer 110 comprises a magnetic polarization that is capable of switching between a parallel configuration with respect to that of the pinned magnetic layer 106 and an anti-parallel configuration. A conductive upper electrode 114 is disposed over the free magnetic layer 110. An encapsulation structure 112 is arranged over the dielectric barrier layer 108 and abuts sidewalls of the free magnetic layer 110.

The pinned magnetic layer 106, the dielectric barrier layer 108, and the free magnetic layer 110 form a magnetic tunnel junction (MTJ) 111. Within the MTJ 111, electrons may tunnel through the dielectric barrier layer 108 (between the pinned magnetic layer 106 and the free magnetic layer 110) upon application of voltage difference between the conductive lower electrode 102 and the conductive upper electrode 114. As the electrons tunnel through the dielectric barrier layer 108, the magnetic polarization of the free magnetic layer 110 may change, thereby changing a resistance of the MTJ 111. For example, if a polarity of the free magnetic layer 110 is aligned with a polarity of the pinned magnetic layer 106, the MTJ 111 has a first resistance value corresponding to a first data state (e.g., a logical "0"). Alternatively, if the polarity of the free magnetic layer 110 is misaligned with the polarity of the pinned magnetic layer 106, the MTJ 111 has a second resistance value corresponding to a second data state (e.g., a logical "1").

The conductive upper electrode 114 has a 'T' shaped structure with a lower portion 116 and an overlying upper portion 118. The lower portion 116 is laterally surrounded by the encapsulation structure 112, while the upper portion 118 abuts an upper surface of the encapsulation structure 112. The upper portion 118 of the conductive upper electrode 114 has greater width than the lower portion 116. The greater width of the upper portion 118 causes the upper portion 118 of the conductive upper electrode 114 to overhang the lower portion 116 of the conductive upper electrode 114.

A via 120 is disposed onto the upper portion 118 of the conductive upper electrode 114. The via 120 is configured to connect the upper portion 118 of the conductive upper electrode 114 to additional back-end-of-the-line (BEOL) metallization layers (e.g., a metal interconnect wire). The greater width of the upper portion 118 of the conductive upper electrode 114 gives the via 120 a larger landing area than the lower portion 116 of the conductive upper electrode 114 would provide, thereby mitigating via punch through resulting from overlay errors between the via 120 and the conductive upper electrode 114.

Figure 2:
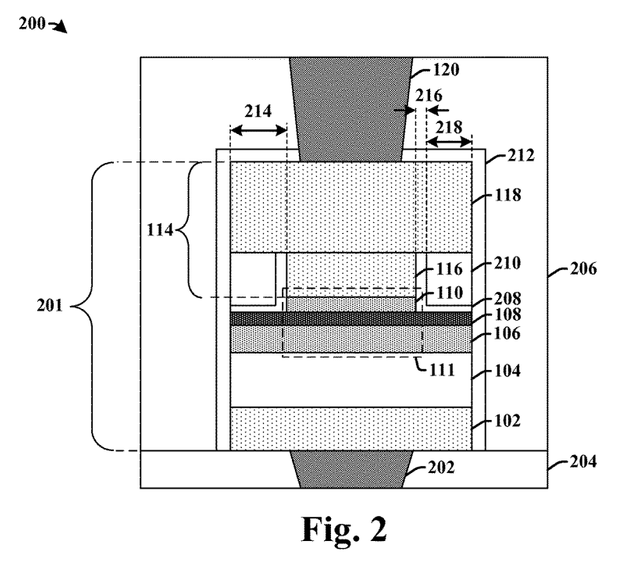
FIG. 2 illustrates some additional embodiments of a MRAM cell having an extended upper electrode.

FIG. 2 illustrates some additional embodiments of an integrated chip 200 having an MRAM cell 201 with an extended upper electrode.

The integrated chip 200 comprises a lower metal interconnect layer 202 disposed within a surrounding first inter-level dielectric (ILD) layer 204. In some embodiments, the lower metal interconnect layer 202 may comprise a via layer comprising copper (Cu) or aluminum (Al), for example. In some embodiments, the first ILD layer 204 may comprise a low-k dielectric layer, an ultra low-k dielectric layer, an extreme low-k dielectric layer, and/or a silicon dioxide layer.

A conductive lower electrode 102 is disposed over and electrically contacts the lower metal interconnect layer 202. An anti-ferromagnetic layer 104 is arranged over the conductive lower electrode 102, and a pinned magnetic layer 106 is arranged over the anti-ferromagnetic layer 104. In some embodiments, the conductive lower electrode 102 may comprise titanium nitride (TiN), tantalum nitride (TaN), titanium (Ti), and/or tantalum (Ta). In some embodiments, the conductive lower electrode 102 may have a thickness in a range of between approximately 10 nm and approximately 100 nm. In some embodiments, the anti-ferromagnetic layer 104 may comprise iridium manganese (IrMn), iron manganese (FeMn), ruthenium manganese (RuMn), nickel manganese (NiMn), and/or palladium platinum manganese (PdPtMn). In some embodiments, the pinned magnetic layer 106 may comprise cobalt (Co), iron (Fe), boron (B), and/or ruthenium (Ru). In some embodiments, the pinned magnetic layer 106 may have a thickness in a range of between approximately 5 nm and approximately 10 nm.

A free magnetic layer 110 is separated from the pinned magnetic layer 106 by a dielectric barrier layer 108. In some embodiments, the dielectric barrier layer 108 may comprise magnesium oxide (MgO) and/or aluminum oxide ($Al_2O_3$) and may have a thickness in a range of between approximately 0.5 nm and approximately 2 nm. In some embodiments, the free magnetic layer 110 may comprise combination of cobalt (Co), iron (Fe), and boron (B) and may have a thickness in a range of between approximately 1 nm and approximately 3 nm.

A conductive upper electrode 114, having a lower portion 116 and an upper portion 118, is disposed over the free magnetic layer 110. In some embodiments, the lower portion 116 and the upper portion 118 of the conductive upper electrode 114 may comprise titanium nitride (TiN), tantalum nitride (TaN), titanium (Ti), and/or tantalum (Ta). In some embodiments, the lower portion 116 and the upper portion 118 of the conductive upper electrode 114 may comprise a same material. In other embodiments, the lower portion 116 and the upper portion 118 of the conductive upper electrode 114 may comprise different materials.

In some embodiments, the upper portion 118 of the conductive upper electrode 114 may laterally extend past the lower portion 116 of the conductive upper electrode 114 by a distance 214 in a range of between approximately 20 nm and approximately 80 nm. In some embodiments, the upper portion 118 of the conductive upper electrode 114, the dielectric barrier layer 108, the pinned magnetic layer 106, the anti-ferromagnetic layer 104, and the conductive lower electrode 102 have substantially the same width. In other words, the upper portion 118 of the conductive upper electrode 114, the dielectric barrier layer 108, the pinned magnetic layer 106, the anti-ferromagnetic layer 104, and the conductive lower electrode 102 have substantially aligned sidewalls.

A dual encapsulation structure is laterally arranged adjacent to the free magnetic layer 110 and the lower portion 116 of the conductive upper electrode 114. The dual encapsulation structure comprises a first encapsulation layer 208 that laterally separates the free magnetic layer 110 from a second encapsulation layer 210. The first encapsulation layer 208 is configured to protect the dielectric barrier layer 108, the free magnetic layer 110, and the lower portion 116 of the conductive upper electrode 114 during fabrication of the integrated chip 200. In some embodiments, the first encapsulation layer 208 may comprise one or more of silicon nitride (SiN) and/or silicon carbide (SiC), while the second encapsulation layer 210 may comprise one or more of silicon nitride (SiN), silicon carbide (SiC), silicon dioxide ($SiO_2$), silicon oxy-nitride (SiON), silicon oxy-carbide (SiOC), and/or a low-k dielectric material. In various embodiments, the first encapsulation layer 208 and the second encapsulation layer 210 may comprise a same material or different materials.

In some embodiments, the first encapsulation layer 208 has an 'L' shape abutting the dielectric barrier layer 108 on a bottom side and abutting the free magnetic layer 110 and the lower portion 116 of the conductive upper electrode 114 on a sidewall. The second encapsulation layer 210 abuts the first encapsulation layer 208 on a bottom side and on a sidewall. In some embodiments, the first encapsulation layer 208 may have a first thickness 216 in a range of between approximately 10 nm and approximately 50 nm, and the second encapsulation layer 210 may have a second thickness 218 in a range of between approximately 10 nm and approximately 70 nm.

A via 120 is disposed onto the upper portion 118 of the conductive upper electrode 114. The via 120 is arranged within a second ILD layer 206 surrounding the MRAM cell 201. In some embodiments, the second ILD layer 206 is separated from the MRAM cell 201 by a dielectric cap layer 212. In some embodiments, the dielectric cap layer 212 may comprise silicon nitride (SiN), for example.

Figure 3:
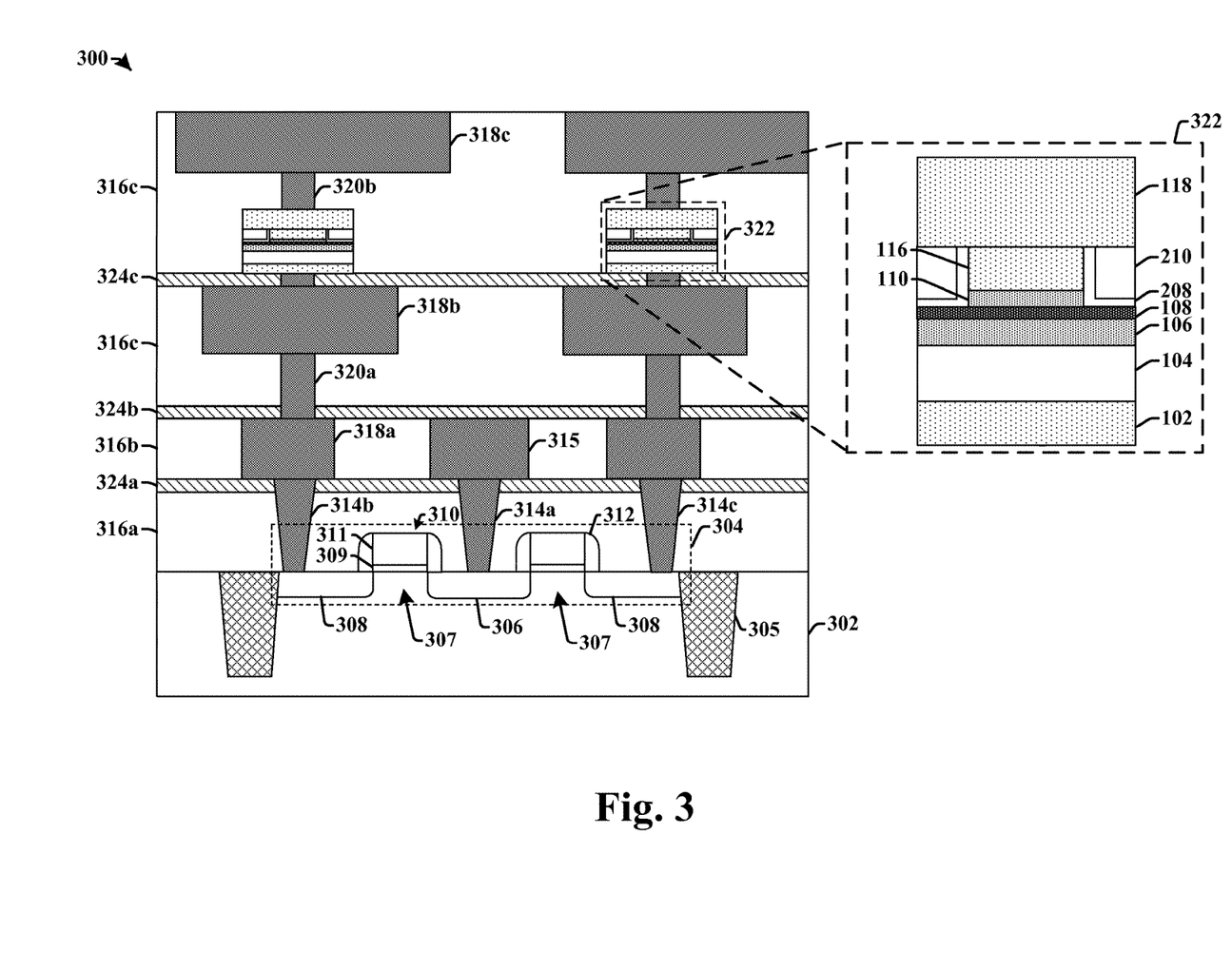
FIG. 3 illustrates some embodiments of an integrated chip having a MRAM cell with an extended upper electrode.

FIG. 3 illustrates some embodiments of an integrated chip 300 having one or more MRAM cells 322 with an extended upper electrode.

The integrated chip 300 comprises a semiconductor body 302. The semiconductor body 302 may be, for example, a bulk semiconductor substrate, such as a bulk silicon substrate, or a silicon-on-insulator (SOI) substrate. One or more selection transistors 304 are arranged within the semiconductor body 302. In some embodiments, the one or more selection transistors 304 are disposed between isolation regions 305 (e.g., STI regions).

In some embodiments, the one or more selection transistors 304 may comprise MOSFET (metal-oxide-silicon field effect transistor) devices. In such embodiments, the one or more selection transistors 304 respectively comprise a source region 306 and a drain region 308, separated by a channel region 307. The source region 306 comprises a first doping type (e.g., an n-type dopant), the channel region 307 comprises a second doping type different than the first doping type, and the drain region 308 comprises the first doping type. In some embodiments, the first doping type comprises an n-type doping, while in other embodiments the first doping type comprises a p-type doping. A gate structure 310, comprising a gate electrode 311 separated from the channel region 307 by a gate oxide layer 309, is configured to control the flow of charge carriers between the source region 306 and the drain region 308. In various embodiments, the gate structure 310 may comprise a doped polysilicon material or a metal material (e.g., TiN, Al, etc.). In some embodiments, sidewalls spacers 312 (e.g., SiN spacers) may be disposed on opposing sides of the gate electrode 311.

A back-end-of-the-line (BEOL) metal stack is disposed over the semiconductor body 302. The BEOL metal stack comprises a first contact 314a configured to connect the source region 306 to a first metal wire layer 315 that acts as a source line. The BEOL metal stack further comprises a plurality of metal interconnect layers configured to connect the drain regions 308 to one or more MRAM cells 322. In some embodiments, the plurality of metal interconnect layers may comprise one or more metal contacts, 314b and 314c, disposed within a first inter-level dielectric (ILD) layer 316a, and configured to electrically couple the drain region 308 to a first metal wire layer 318a disposed within a second ILD layer 316b. The plurality of metal interconnect layers may further comprise a first metal via layer 320a, disposed within a third ILD layer 316c, and configured to electrically couple the first metal wire layer 318a to a second metal wire layer 318b disposed within the third ILD layer 316c. The one or more MRAM cells 322 are disposed within a second metal via layer 320b between the second metal wire layer 318b and an overlying third metal wire layer 318c. The third metal wire layer 318c may be configured to act as a bit line. In some embodiments, the inter-level dielectric (ILD) layers 316 are separated by etch stop layers (ESL) 324 (e.g., SiN).

Figure 4:
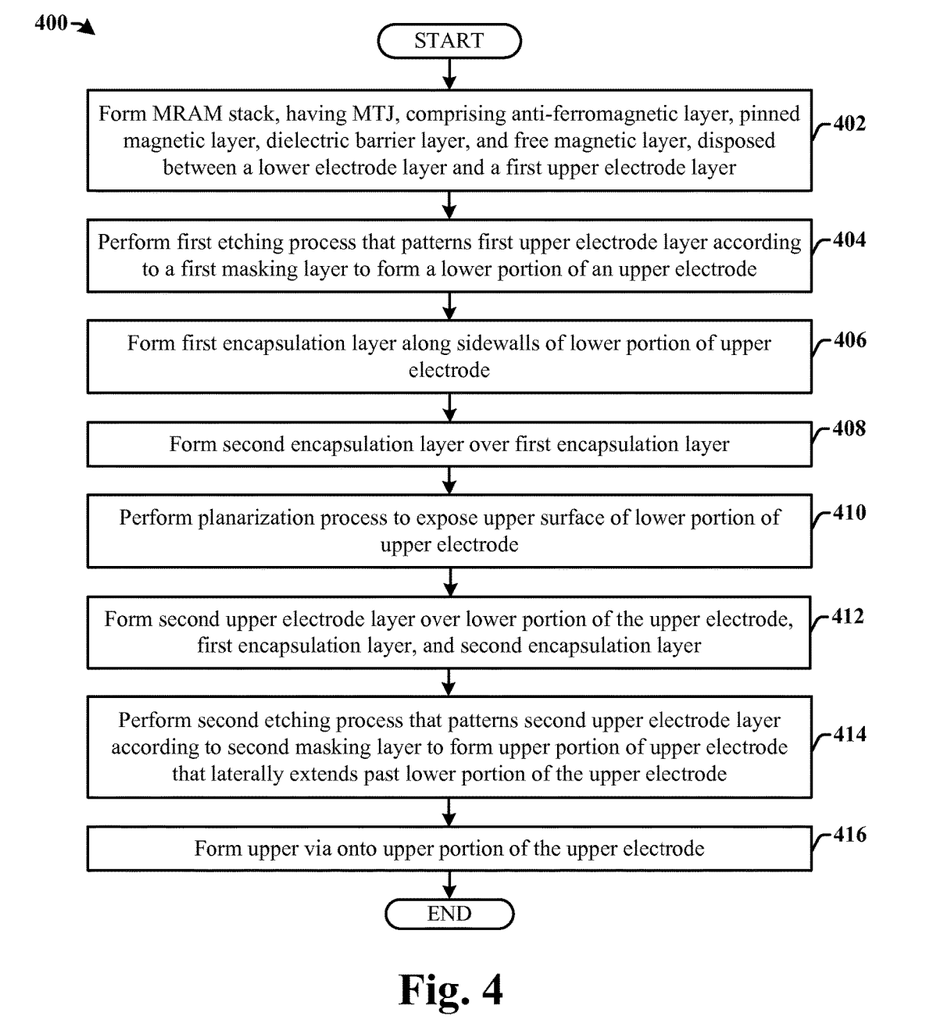
FIG. 4 illustrates a flow diagram of some embodiments of a method of forming a MRAM cell with an extended upper electrode.

FIG. 4 illustrates a flow diagram of some embodiments of a method 400 of forming a MRAM cell with an extended upper electrode.

While the disclosed method 400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, an MRAM stack is formed over a semiconductor body. The MRAM stack has a magnetic tunnel junction (MTJ) disposed between a conductive lower electrode layer and a first upper electrode layer. In some embodiments, the MTJ comprises an anti-ferromagnetic layer, a pinned magnetic layer, a dielectric barrier layer, and a free magnetic layer.

At 404, a first etching process is performed to pattern the first upper electrode layer according to a first masking layer to form a lower portion of a conductive upper electrode. The first etching process may also etch the free magnetic layer.

At 406, a first encapsulation layer is formed along sidewalls of the lower portion of the conductive upper electrode. The first encapsulation layer may also be formed onto the dielectric barrier layer, and along sidewalls of the free magnetic layer. In some embodiments, the first encapsulation layer is formed in-situ with the first etching process (i.e., within a same reactant chamber held under vacuum to avoid contamination or oxidation). In such embodiments, the first encapsulation layer provides protection to the MTJ by eliminating exposure of the MTJ to ambient conditions (e.g., air) that may damage or degrade one or more layers of the MTJ.

At 408, a second encapsulation layer is formed over the first encapsulation layer.

At 410, a planarization process is performed to expose an upper surface of the lower portion of the conductive upper electrode.

At 412, a second upper electrode layer is formed over the lower portion of the conductive upper electrode, the first encapsulation layer, and the second encapsulation layer.

At 414, a second etching process is performed to pattern the second upper electrode layer according to a second masking layer to form an upper portion of the conductive upper electrode that laterally extends past the lower portion of the conductive upper electrode.

At 416, an upper via is formed onto the upper portion of the conductive upper electrode.

FIGS. 5-12 illustrate some embodiments of cross-sectional views showing a method of forming a MRAM cell with an extended upper electrode. Although FIGS. 5-12 are described in relation to method 400, it will be appreciated that the structures disclosed in FIGS. 5-12 are not limited to such a method, but instead may stand alone as structures independent of the method.

Figure 5:
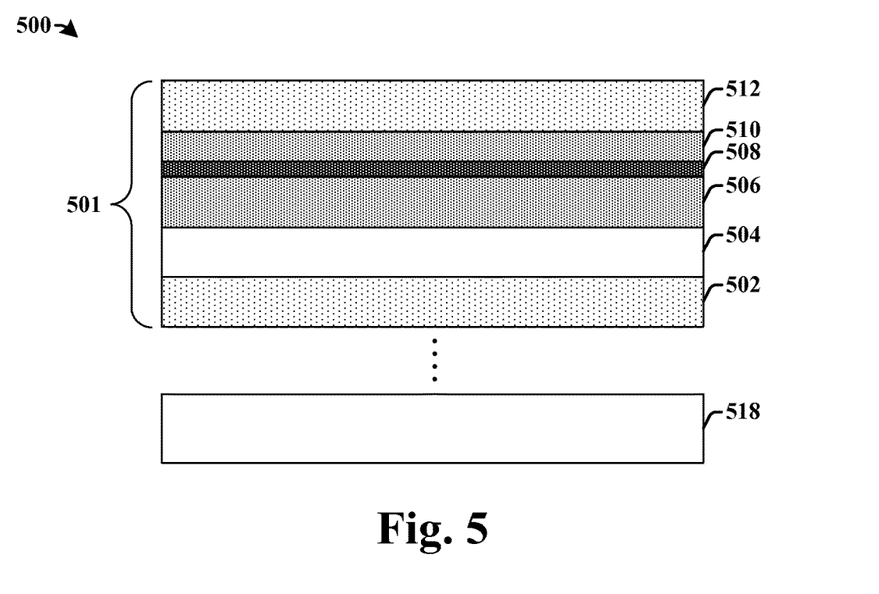
FIGS. 5-12 illustrate some embodiments of cross-sectional views showing a method of forming a MRAM cell with an extended upper electrode.

FIG. 5 illustrates some embodiments of a cross-sectional view 500 of an integrated chip corresponding to act 402.

As shown in cross-sectional view 500, an MRAM stack 501 is formed over a semiconductor body 518. The MRAM stack 501 comprises a plurality of layers including conductive lower electrode layer 502, an anti-ferromagnetic layer 504 overlying the conductive lower electrode layer 502, a pinned magnetic layer 506 overlying the anti-ferromagnetic layer 504, a dielectric barrier layer 508, a free magnetic layer 510 overlying the pinned magnetic layer 506, and a first upper electrode layer 512 overlying the free magnetic layer 510. The plurality of layers may be formed by way of deposition processes (e.g., chemical vapor deposition (CVD), physical vapor deposition (PVD), atomic layer deposition (ALD), etc.).

Figure 6:
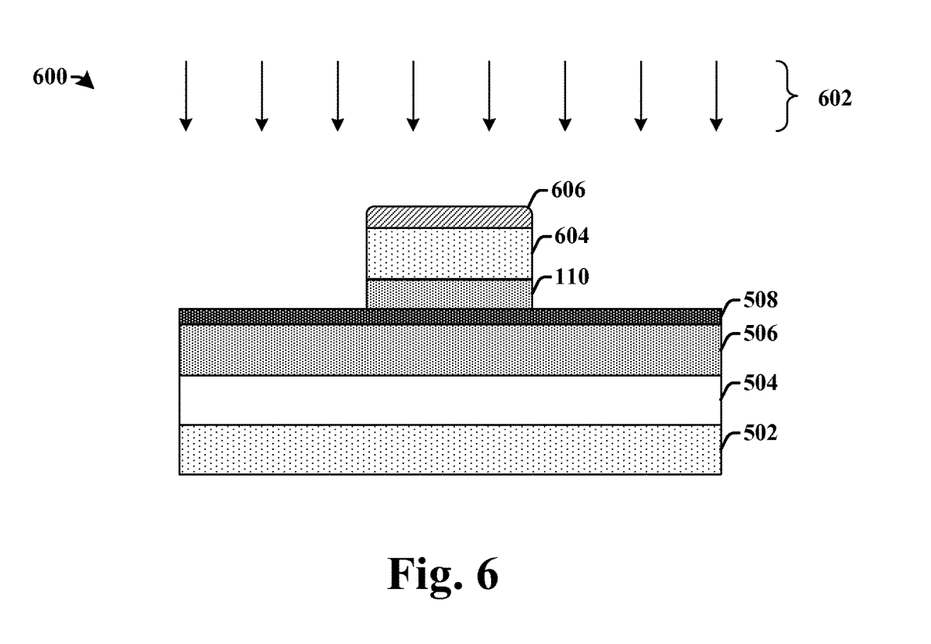

FIG. 6 illustrates some embodiments of a cross-sectional view 600 of an integrated chip corresponding to act 404.

As shown in cross-sectional view 600, a first etching process is performed to pattern the free magnetic layer 110 and the first upper electrode layer 604. The first etching process may be performed by selectively exposing the first upper electrode layer 604 to a first etchant 602 according to a first masking layer 606. In some embodiments, the first etchant 602 may comprise a dry etchant. In some embodiments, the dry etchant may have an etching chemistry comprising one or more of oxygen (O2), nitrogen (N2), hydrogen (H2), argon (Ar), carbon monoxide (CO), alcohol, and/or a fluorine species (e.g., $CF_4$, $CHF_3$, $C_4F_8$, etc.). In other embodiments, the first etchant 602 may comprise a wet etchant comprising a buffered hydroflouric acid (BHF).

In some embodiments, the first masking layer 606 may comprise a first hard mask layer. In such embodiments, the first hard mask layer may be deposited onto an upper surface of the first upper electrode layer 604. The first hard mask layer may be subsequently patterned according to a photoresist layer patterned using lithographic methods. In other embodiments, the first masking layer 606 may comprise a dielectrical layer.

Figure 7:
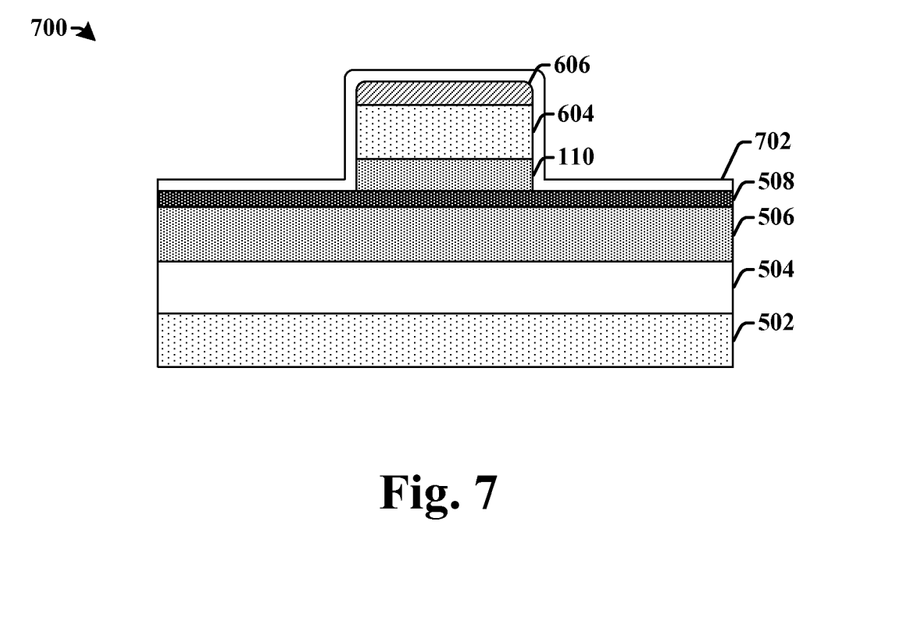

FIG. 7 illustrates some embodiments of a cross-sectional view 700 of an integrated chip corresponding to act 406.

As shown in cross-sectional view 700, a first encapsulation layer 702 is formed onto the dielectric barrier layer 508, and along sidewalls of the free magnetic layer 110 and the first upper electrode layer 604. In some embodiments, the first encapsulation layer 702 may be formed by way of a deposition process (e.g., chemical vapor deposition (CVD), physical vapor deposition (PVD), atomic layer deposition (ALD), etc.). The first encapsulation layer 702 may comprise a dielectric material such as silicon nitride, silicon carbide, and/or an oxide. The first encapsulation layer 702 may be deposited to a thickness in a range of between approximately 10 nm and approximately 50 nm.

In some embodiments, the first encapsulation layer 702 is formed in-situ with the first etching process (i.e., within a same platform held under vacuum to avoid contamination or oxidation due to exposure to an external environment). In various embodiments, the first etching process and deposition of the first encapsulation layer 702 may be done within different chambers of a processing tool (respectively held under vacuum) or within a same chamber of a processing tool. By forming the first encapsulation layer 702 in-situ with the first etching process, the MTJ is protected from ambient conditions that may degrade or damage one or more layers of the MTJ.

Figure 8:
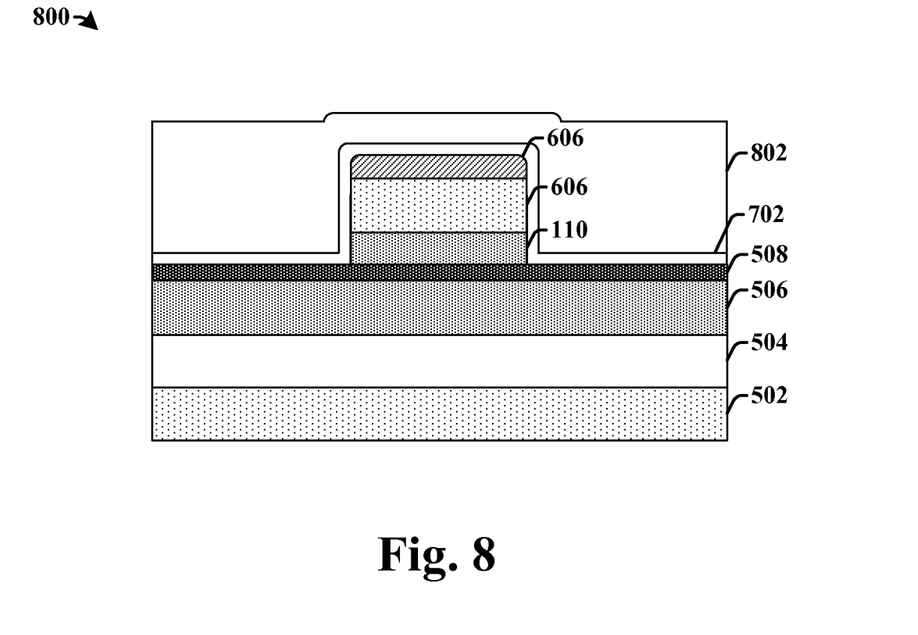

FIG. 8 illustrates some embodiments of a cross-sectional view 800 of an integrated chip corresponding to act 408.

As shown in cross-sectional view 800, a second encapsulation layer 802 is formed over the first encapsulation layer 702. The second encapsulation layer 802 may be formed by way of a deposition process (e.g., chemical vapor deposition (CVD), physical vapor deposition (PVD), atomic layer deposition (ALD), etc.). The second encapsulation layer 802 may comprise a dielectric material such as silicon nitride (SiN), silicon carbide (SiC), silicon dioxide ($SiO_2$), silicon oxy-nitride (SiON), silicon oxy-carbide (SiOC), or a low-k dielectric material. The second encapsulation layer 802 may be deposited to a thickness in a range of between approximately 10 nm and approximately 70 nm.

Figure 9:
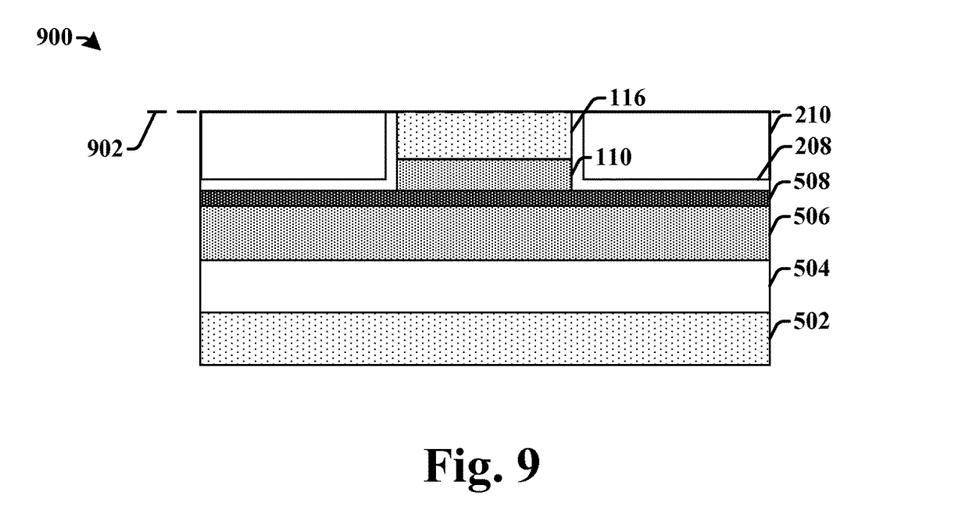

FIG. 9 illustrates some embodiments of a cross-sectional view 900 of an integrated chip corresponding to act 410.

As shown in cross-sectional view 900, a planarization process is performed. The planarization process removes parts of the first encapsulation layer (e.g., element 702 of FIG. 8) and the second encapsulation layer (e.g., element 802 of FIG. 8) along line 902, to expose an upper surface of a lower portion 116 of a conductive upper electrode. In some embodiments, the planarization process may comprise a chemical mechanical polishing (CMP) process. In other embodiments, the planarization process may comprise an etching process.

Figure 10:
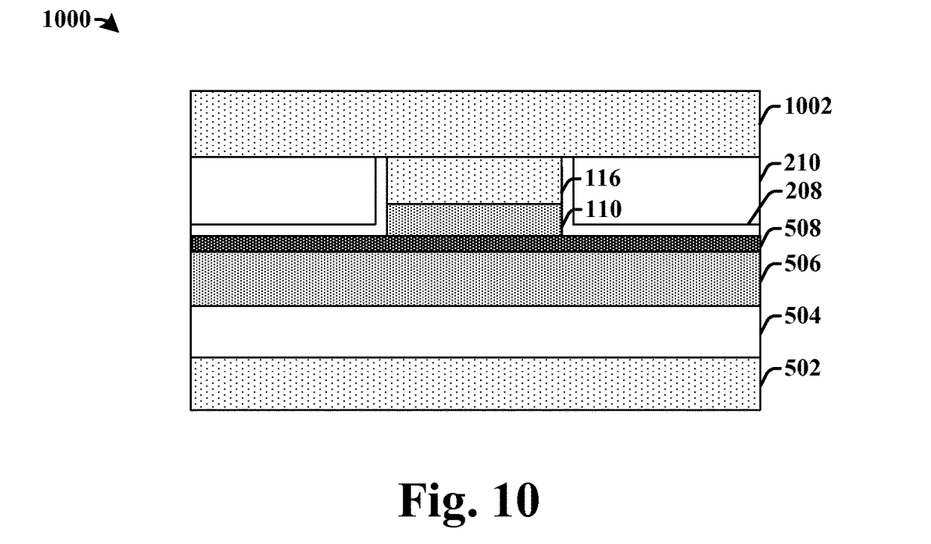

FIG. 10 illustrates some embodiments of a cross-sectional view 1000 of an integrated chip corresponding to act 412.

As shown in cross-sectional view 1000, a second upper electrode layer 1002 is formed over the lower portion 116 of the conductive upper electrode, the first encapsulation layer 208, and the second encapsulation layer 210. In some embodiments, a lower surface of the second upper electrode layer 1002 abuts an upper surface of the lower portion 116 of the conductive upper electrode, the first encapsulation layer 208, and the second encapsulation layer 210. The second upper electrode layer 1002 may be formed by way of a deposition process (e.g., chemical vapor deposition (CVD), physical vapor deposition (PVD), atomic layer deposition (ALD), etc.).

Figure 11:
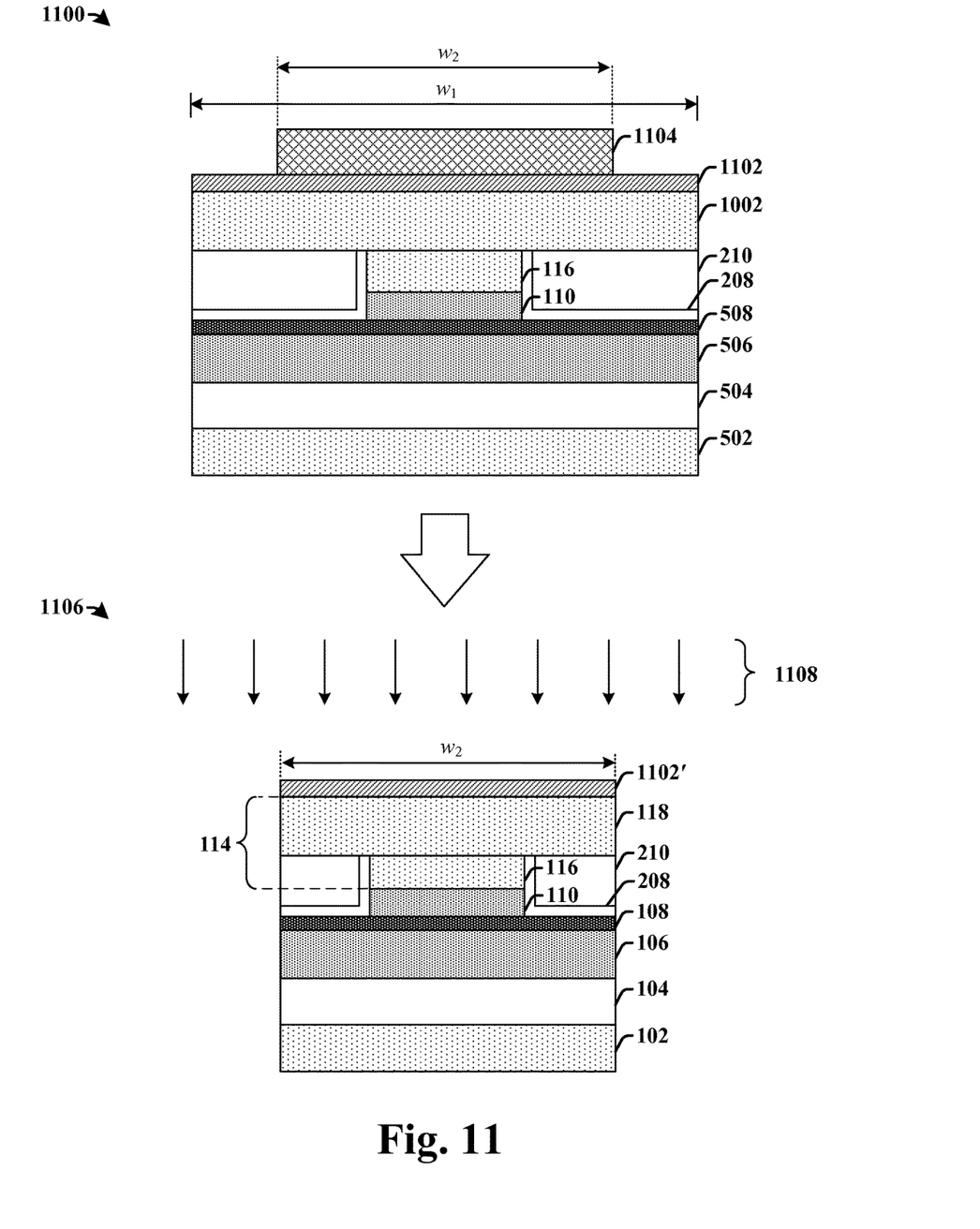

FIG. 11 illustrates some embodiments of cross-sectional views, 1100 and 1106, of an integrated chip corresponding to act 414.

As shown in cross-sectional view 1100, a second masking layer is formed over the second upper electrode layer 1002. In some embodiments, the second masking layer may comprise a second hard mask layer 1102. In such embodiments, the second hard mask layer 1102 may be deposited onto an upper surface of the second upper electrode layer 1002. The second hard mask layer 1102 may be subsequently patterned according to a photoresist layer 1104, which is patterned using lithographic methods, to reduce a width of the second hard mask layer 1102 from $w_1$ to $w_2$. In some alternative embodiments (not shown), the second masking layer may comprise a photoresist layer.

As shown in cross-sectional view 1106, a second etching process is performed according to the patterned second hard mask layer 1102' to define an upper portion 118 of the conductive upper electrode 114 overlying the lower portion 116 of the conductive upper electrode 114. The upper portion 118 of the conductive upper electrode 114 laterally extends past the lower portion 116 of the conductive upper electrode 114. The second etching process may cause sidewalls of the upper portion 118 of the conductive upper electrode 114 to be laterally aligned with sidewalls of the dielectric barrier layer 108, the pinned magnetic layer 106, the anti-ferromagnetic layer 104, and the conductive lower electrode 102.

The second etching process may be performed by selectively exposing the second upper electrode layer 1002 to a second etchant 1108 according to patterned second hard mask layer 1102'. In some embodiments, the second etchant 1108 may comprise a dry etchant having an etching chemistry comprising one or more of oxygen (O2), nitrogen (N2), hydrogen (H2), argon (Ar), and/or a fluorine species (e.g., $C_{F4}$, $CH_{F3}$, $C_{4F8}$, etc.). In other embodiments, the second etchant 1108 may comprise a wet etchant comprising a buffered hydroflouric acid (BHF).

Figure 12:
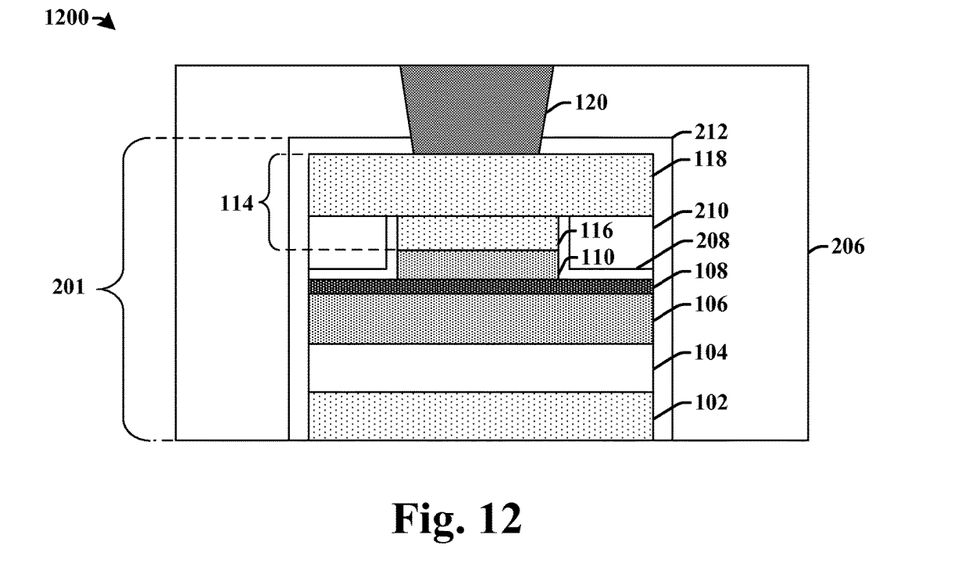

FIG. 12 illustrates some embodiments of a cross-sectional view 1200 of an integrated chip corresponding to act 416.

As shown in cross-sectional view 1200, a via 120 is formed within an ILD layer 206 onto the upper portion 118 of the conductive upper electrode 114. The ILD layer 206 is formed to surround the MRAM cell 201. In some embodiments, a capping layer 212 may be formed onto the MRAM cell 201 prior to formation of the ILD layer 206. The ILD layer 206 is then selectively etched to form an opening, in which a conductive material (e.g., copper, aluminum, etc.) is subsequently deposited. The conductive material may be deposited using a deposition process and/or a plating process (e.g., electroplating, electroless plating, etc.). In some embodiments, the ILD layer 206 may comprise a low-k dielectric layer, an extreme low-k dielectric layer, or a silicon dioxide layer. In some embodiments, the capping layer 212 may comprise silicon nitride (SiN), for example.

Therefore, the present disclosure relates to a magnetoresistive random access memory (MRAM) cell having an extended upper electrode, and a method of formation.

In some embodiments, the present disclosure relates to a magnetic random access memory (MRAM) device. The MRAM device comprises a magnetic tunnel junction (MTJ) disposed over a conductive lower electrode. The MRAM device further comprises a conductive upper electrode comprising a lower portion arranged vertically over the magnetic tunnel junction and laterally surrounded by an encapsulation structure, and an upper portion located on the lower portion and the encapsulation structure. The upper portion of the conductive upper electrode laterally extends past the lower portion of the conductive upper electrode.

In other embodiments, the present disclosure relates to a magnetic random access memory (MRAM) device. The MRAM device comprises an anti-ferromagnetic layer disposed over a conductive lower electrode abutting a lower metal interconnect layer, a magnetic pinned layer arranged over the anti-ferromagnetic layer, a dielectric barrier layer arranged over the magnetic pinned layer, and a magnetic free layer arranged over the dielectric barrier layer. The MRAM device further comprises a dual encapsulation structure having a second encapsulation layer laterally separated from the magnetic free layer by a first encapsulation layer. The MRAM device further comprises a conductive upper electrode comprising a lower portion arranged onto the magnetic free layer and laterally surrounded by the dual encapsulation structure, and an upper portion located on the lower portion and the dual encapsulation structure.

In yet other embodiments, the present disclosure relates to a method of forming an MRAM cell. The method comprises forming an MRAM stack having a magnetic tunnel junction (MTJ) disposed between a conductive lower electrode layer and a first upper electrode layer. The method further comprises performing a first etching process that patterns the first upper electrode layer to form a lower portion of a conductive upper electrode. The method further comprises forming an encapsulation structure laterally surrounding the lower portion of the conductive upper electrode. The method further comprises forming a second upper electrode layer over the lower portion of the conductive upper electrode and the encapsulation structure. The method further comprises performing a second etching process that patterns the second upper electrode layer to form an upper portion of the conductive upper electrode that laterally extends past the lower portion of the conductive upper electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetic random access memory (MRAM) device, comprising:
    a magnetic tunnel junction (MTJ) disposed over a conductive lower electrode and comprising:
        an anti-ferromagnetic layer disposed over the conductive lower electrode;
        a magnetic pinned layer arranged over the anti-ferromagnetic layer;
        a dielectric barrier layer arranged over the magnetic pinned layer;
        a magnetic free layer arranged over the dielectric barrier layer;
    an encapsulation structure arranged directly over the dielectric barrier layer and laterally surrounding the magnetic free layer;
    a conductive upper electrode comprising a lower portion arranged vertically over the magnetic tunnel junction and laterally surrounded by the encapsulation structure, and an upper portion located on the lower portion and the encapsulation structure, wherein the upper portion of the conductive upper electrode laterally extends past the lower portion of the conductive upper electrode;
    a dielectric cap layer arranged along sidewalls and an upper surface of the upper portion of the conductive upper electrode, wherein the anti-ferromagnetic layer contacts the dielectric cap layer; and
    an inter-level dielectric layer continuously extending from over the dielectric cap layer to along sidewalls of the dielectric cap layer.

2. The MRAM device of claim 1, wherein the upper portion of the conductive upper electrode, the dielectric barrier layer, the magnetic pinned layer, the anti-ferromagnetic layer, and the conductive lower electrode have a substantially same width, which is larger than a width of the lower portion of the conductive upper electrode and the magnetic free layer.

3. The MRAM device of claim 1,
    wherein the encapsulation structure comprises a second encapsulation layer laterally separated from the lower portion of the conductive upper electrode by a first encapsulation layer, and wherein the first encapsulation layer extends from an upper surface of the dielectric barrier layer to a lower surface of the upper portion of the conductive upper electrode.

4. The MRAM device of claim 3,
wherein the first encapsulation layer has an 'L' shape abutting the dielectric barrier layer on a bottom side and abutting the magnetic free layer and the lower portion of the conductive upper electrode on a sidewall; and
wherein a bottom side and a sidewall of the second encapsulation layer abut the first encapsulation layer.

5. The MRAM device of claim 3, wherein a lower surface of the upper portion of the conductive upper electrode abuts upper surfaces of the first encapsulation layer and the second encapsulation layer.

6. The MRAM device of claim 3, wherein the upper portion of the conductive upper electrode extends past the lower portion of the conductive upper electrode by a distance in a range of between approximately 20 nm and approximately 80 nm.

7. The MRAM device of claim 1, wherein the magnetic pinned layer is arranged below the encapsulation structure.

8. The MRAM device of claim 1, wherein the dielectric barrier layer is arranged below the encapsulation structure.

9. A magnetic random access memory (MRAM) device, comprising:
an anti-ferromagnetic layer disposed over a conductive lower electrode abutting a lower metal interconnect layer;
a magnetic pinned layer arranged over the anti-ferromagnetic layer;
a dielectric barrier layer arranged over the magnetic pinned layer, wherein the anti-ferromagnetic layer has sidewalls that are aligned with sidewalls of the magnetic pinned layer and the dielectric barrier layer;
a magnetic free layer arranged over the dielectric barrier layer;
a dual encapsulation structure having a second encapsulation layer laterally separated from the magnetic free layer by a first encapsulation layer; and
a conductive upper electrode comprising a lower portion arranged onto the magnetic free layer and laterally surrounded by the dual encapsulation structure, and an upper portion located on the lower portion and the dual encapsulation structure, wherein the upper portion has a sidewall that is flush with a sidewall of the encapsulation structure.

10. The MRAM device of claim 9,
wherein the first encapsulation layer has an 'L' shape abutting the dielectric barrier layer on a bottom side and abutting the magnetic free layer and the lower portion of the conductive upper electrode on a sidewall; and
wherein a bottom side and a sidewall of the second encapsulation layer abut the first encapsulation layer.

11. The MRAM device of claim 9, wherein the upper portion of the conductive upper electrode is flush with the second encapsulation layer.

12. The MRAM device of claim 9, wherein the upper portion of the conductive upper electrode extends past the lower portion of the conductive upper electrode by a distance in a range of between approximately 20 nm and approximately 80 nm.

13. The MRAM device of claim 9, wherein the conductive lower electrode is electrically coupled to a drain of a selection transistor disposed within a semiconductor body underlying the conductive lower electrode.

14. The MRAM device of claim 9, wherein the upper portion of the conductive upper electrode, the dielectric barrier layer, the magnetic pinned layer, the anti-ferromagnetic layer, and the conductive lower electrode have a substantially same width.

15. The MRAM device of claim 9, wherein the magnetic pinned layer is arranged below the encapsulation structure.

16. The MRAM device of claim 9, wherein the dielectric barrier layer is arranged below the encapsulation structure.

17. The MRAM device of claim 9, wherein the dielectric barrier layer extends laterally past opposing sidewalls of the magnetic free layer.

18. The MRAM device of claim 9, wherein the dielectric barrier layer extends laterally past opposing sidewalls of the magnetic free layer.

19. A method of forming an MRAM cell, comprising:
forming an MRAM stack having a magnetic tunnel junction (MTJ) disposed between a lower electrode layer and a first upper electrode layer, wherein the MRAM stack comprises:
an anti-ferromagnetic layer disposed over the lower electrode layer;
a magnetic pinned layer arranged over the anti-ferromagnetic layer;
a dielectric barrier layer arranged over the magnetic pinned layer; and
a magnetic free layer arranged over the dielectric barrier layer; performing a first etching process that patterns the first upper electrode layer to form a lower portion of a conductive upper electrode;
forming an encapsulation structure laterally surrounding the lower portion of the conductive upper electrode;
forming a second upper electrode layer over the lower portion of the conductive upper electrode and the encapsulation structure; and
performing a second etching process that etches the second upper electrode layer to form an upper portion of the conductive upper electrode that laterally extends past the lower portion of the conductive upper electrode, that etches the lower electrode layer to form a lower electrode, and that etches the MRAM stack.

20. The method claim 19, wherein the second etching process also etches the anti-ferromagnetic layer, the dielectric barrier layer, and the magnetic pinned layer, in a manner that causes sidewalls of the upper portion of the conductive upper electrode to be substantially aligned with sidewalls of the lower electrode layer, the anti-ferromagnetic layer, the dielectric barrier layer, and the magnetic pinned layer.

* * * * *